United States Patent
Lee et al.

(10) Patent No.: US 8,932,941 B2
(45) Date of Patent: Jan. 13, 2015

(54) GRAPHENE DEVICE AND METHOD OF FABRICATING THE SAME

(71) Applicant: Samsung Electronics Co., Ltd., Suwon-si (KR)

(72) Inventors: Joo-ho Lee, Hwaseong-si (KR); Tae-han Jeon, Hwaseong-si (KR); Yong-sung Kim, Namyangju-si (KR); Chang-seung Lee, Yongin-si (KR); Yong-seok Jung, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/856,022

(22) Filed: Apr. 3, 2013

(65) Prior Publication Data

US 2014/0061590 A1    Mar. 6, 2014

(30) Foreign Application Priority Data

Aug. 29, 2012    (KR) .................. 10-2012-0095172

(51) Int. Cl.
*H01L 21/20* (2006.01)
*H01L 21/36* (2006.01)
(Continued)

(52) U.S. Cl.
CPC ...... *H01L 29/1606* (2013.01); *H01L 21/02527* (2013.01); *Y10S 977/734* (2013.01); *B82Y 40/00* (2013.01)
USPC .............. 438/478; 438/479; 257/29; 977/734

(58) Field of Classification Search
USPC .................. 257/29, E21.09; 438/478, 479
See application file for complete search history.

(56) References Cited

U.S. PATENT DOCUMENTS 7,305,883 B2    12/2007    Khuri-Yakub et al.
7,939,247 B2    5/2011    Chen et al.
(Continued)

FOREIGN PATENT DOCUMENTS

JP    2011175996 A    9/2011
JP    4958245 B2    6/2012
(Continued)

OTHER PUBLICATIONS

Ye Lu, "In Situ Electronic Characterization of Graphene Nanoconstrictions Fabricated in a Transmission Electron Microscope", ACS Publications, American Chemical Society, 2011, 5184-5188.

(Continued)

*Primary Examiner* — Phuc Dang
(74) *Attorney, Agent, or Firm* — Harness, Dickey & Pierce, P.L.C.

(57) ABSTRACT

The method of manufacturing a graphene device includes forming an insulating material layer on a substrate, forming first and second metal pads on the insulating material layer spaced apart from each other, forming a graphene layer having a portion defined as an active area between the first and second metal pads on the insulating material layer, forming third and fourth metal pads on the graphene layer spaced apart from each other with the active area therebetween, the third and fourth metal pads extending above the first metal pad and the second metal pad, respectively, forming a first protection layer to cover all the first and second metal pads, the graphene layer, and the third and fourth metal pads, and etching an entire surface of the first protection layer until only a residual layer made of a material for forming the first protection layer remains on the active area.

17 Claims, 5 Drawing Sheets

(51) Int. Cl.
*H01L 29/16* (2006.01)
*H01L 21/02* (2006.01)
*B82Y 40/00* (2011.01)

(56) References Cited

U.S. PATENT DOCUMENTS

| | | |
|---|---|---|
| 8,119,426 B2 | 2/2012 | Kobayashi et al. |
| 2009/0174435 A1 | 7/2009 | Stan et al. |
| 2010/0255623 A1 | 10/2010 | Huang |
| 2011/0071397 A1 | 3/2011 | Wodnicki et al. |
| 2011/0101528 A1 | 5/2011 | Akimoto et al. |
| 2011/0303899 A1 | 12/2011 | Padhi et al. |
| 2012/0048181 A1 | 3/2012 | Barker et al. |
| 2012/0256167 A1* | 10/2012 | Heo et al. ................ 257/27 |
| 2012/0325664 A1* | 12/2012 | Shim et al. ................ 204/601 |
| 2013/0248823 A1* | 9/2013 | Bol et al. ................ 257/29 |

FOREIGN PATENT DOCUMENTS

| | | |
|---|---|---|
| KR | 20110031406 A | 3/2011 |
| KR | 20110050523 A | 5/2011 |
| KR | 20110111066 A | 10/2011 |
| KR | 101082335 B1 | 11/2011 |
| KR | 20110133452 A | 12/2011 |
| KR | 101101387 B1 | 1/2012 |
| KR | 20120030780 A | 3/2012 |

OTHER PUBLICATIONS

Bala Murali Venkatensan, "Stacked Graphene-Al2O3 Nanopore Sensors for Sensitive Detection of DNA and DNA-Protein Complexes", ACS Nano, American Chemical Society 2011, vol. 6, No. 1, 441-450, 2012.

* cited by examiner

GRAPHENE DEVICE AND METHOD OF FABRICATING THE SAME

CROSS-REFERENCE TO RELATED APPLICATIONS

This application claims the benefit of Korean Patent Application No. 10-2012-0095172, filed on Aug. 29, 2012, in the Korean Intellectual Property Office, the disclosures of which are incorporated herein in their entirety by reference.

BACKGROUND

1. Field

Example embodiments relate to a graphene device and a method of manufacturing the same.

2. Description of the Related Art

Graphene is a material having a 2-dimensional hexagonal carbon structure and may be as thin as a one-atom thick sheet. Also, graphene may conduct electricity 100 times faster than a single crystal silicon, which is mainly used as a semiconductor. Graphene is a zero gap semiconductor that may replace a conventional semiconductor material, and thus, graphene has drawn attention as a base material for electronic circuits.

Graphene is generally formed on a metal thin film, e.g., Cu or Ni, by using a chemical vapor deposition (CVD) method or formed on an SiC substrate by using a pyrolysis method. However, graphene needs to be grown on an insulation layer in order to use the graphene thin layer as a graphene device, e.g., a semiconductor device or a nanogap sensor. In other words, the graphene grown on the metal thin film is transferred onto the insulation layer and then patterned.

In order to improve a resolution of a graphene device, nano-patterning needs to be performed on graphene. However, a quality of the graphene may be degraded during this process. For example, when electron beam lithography is used, the graphene may be damaged due to an interaction between an electron beam resist and the graphene or during a process of removing the electron beam resist. It is difficult to form a high-quality graphene thin layer on an insulation layer with up-to-date techniques.

SUMMARY

Example embodiments provide a graphene device and a method of manufacturing the same. Additional aspects will be set forth in part in the description which follows and, in part, will be apparent from the description, or may be learned by practice of example embodiments.

According to example embodiments, a method of manufacturing a graphene device may include forming an insulating material layer on a substrate; forming a first metal pad and a second metal pad on the insulating material layer to be spaced apart from each other; forming a graphene layer between the first metal pad and the second metal pad on the insulating material layer, wherein a part of the graphene layer is defined as an active area; forming a third metal pad and a fourth metal pad on the graphene layer to be spaced apart from each other with the active area therebetween, wherein the third metal pad and the fourth metal pad extend above the first metal pad and the second metal pad, respectively; forming a first protection layer to cover all the first metal pad, the second metal pad, the graphene layer, the third metal pad, and the fourth metal pad; and etching an entire surface of the first protection layer, wherein a residual layer formed of a material for forming the first protection layer remains on the active area.

The forming the first metal pad and the second metal pad may include forming a first metal layer on the insulating material layer and patterning the first metal layer into the first metal pad and the second metal pad.

The first metal layer may include any one selected from the group consisting of gold (Au), copper (Cu), palladium (Pd), nickel (Ni), titanium (Ti), chromium (Cr), iron (Fe), cobalt (Co), platinum (Pt), and ruthenium (Ru).

The forming the graphene layer may include forming the graphene layer to cover all the insulating material layer, the first metal pad, and the second metal pad.

The forming the graphene layer may include: forming graphene on a metal catalyst layer by chemical vapor deposition (CVD); and transferring the formed graphene onto the insulating material layer, the first metal pad, and the second metal pad.

The forming the third metal pad and the fourth metal pad may include forming a second metal layer on the graphene layer and patterning the second metal layer into the third metal pad and the fourth metal pad.

The second metal layer may include any one material selected from the group consisting of Au, Cu, Pd, Ni, Ti, Cr, Fe, Co, Pt, and Ru.

The second metal layer may be formed to have a thickness in a range between about 10 nm and about 1000 nm.

In the forming of the first protection layer, the first protection layer may be formed in such a way that a thickness of the first protection layer on the active area is greater than a thickness of the first protection layer formed on an area other than the active area.

In the forming of the first protection layer, the first protection layer may be formed in such a way that the thickness of the first protection layer on the active area is equal to greater than thicknesses of the third metal pad and the fourth metal pad.

In the forming of the first protection layer, atomic layer deposition (ALD), CVD, or evaporation may be used.

The first protection layer may include any one material selected from the group consisting of $Al_2O_3$, $SiO_2$, HfO, and SiNx.

In the forming of the first protection layer, the first protection layer may be formed to have a thickness that is equal to or greater than half a distance between the third electrode pad and the fourth electrode pad.

The method may further include forming a second protection layer to cover all the third metal pad and the fourth metal pad and parts of the first metal pad and the second metal pad.

The method may further include forming an opening in a lower portion of the substrate to expose the insulating material layer.

The method may further include forming a nanopore penetrating the second protection layer, the first protection layer, the active area, and the insulating material layer.

The method may further include removing the residual layer remaining on the active area.

The method may further include forming a gate layer with a metal material on the residual layer remaining on the active area.

According to example embodiments, a graphene device includes a substrate; an insulating material layer formed on the substrate; a first metal pad and a second metal pad that are formed on the insulating material layer to be spaced apart from each other; a graphene layer formed between the first metal pad and the second metal pad on the insulating material layer, wherein a part of the graphene layer is defined as an active area; a third metal pad and a fourth metal pad that are formed on the graphene layer to be spaced apart from each other with the active area therebetween, wherein the third metal pad and the fourth metal pad extend above the first metal pad and the second metal pad, respectively; and a protection layer formed to cover the active area.

An opening may further be formed in a lower portion of the substrate to expose the insulating material layer, and a nanopore is further formed to penetrate the protection layer, the graphene layer, and the insulating material layer.

The graphene device may include a gate layer on the protection layer, wherein the gate layer is formed of a metal material.

BRIEF DESCRIPTION OF THE DRAWINGS

These and/or other aspects will become apparent and more readily appreciated from the following description of example embodiments, taken in conjunction with the accompanying drawings in which.

DETAILED DESCRIPTION

Figure 1A:
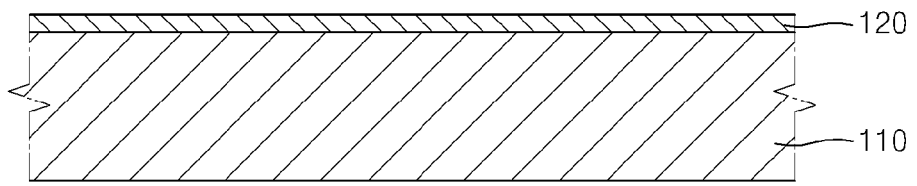
FIGS. 1A to 1H are views for describing a method of manufacturing a graphene device, according to example embodiments.

Hereinafter, a semiconductor buffer structure and a semiconductor device including the same will now be described more fully with reference to the accompanying drawings, in which example embodiments are shown. Like reference numerals refer to like elements throughout, and a size of each of the elements may be exaggerated for clarity and ease of the description. Accordingly, the embodiments are merely described below to explain aspects of the present description, and thus, example embodiments may have different forms and should not be construed as being limited to the descriptions set forth herein. It will be understood that when an element is referred to as being "on" another element, the element or layer can be directly on another element or intervening elements. Like reference numerals denote like elements throughout the specification. As used herein, the term "and/or" includes any and all combinations of one or more of the associated listed items.

It will be understood that, although the terms "first", "second", etc. may be used herein to describe various elements, components, regions, layers and/or sections, these elements, components, regions, layers and/or sections are not to be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise.

It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments are not to be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, is to be interpreted as having a meaning that is consistent with their meaning in the context of the relevant art and will not be interpreted in an idealized or overly formal sense unless expressly so defined herein.

FIGS. 1A to 1H are views for describing a method of manufacturing a graphene device, according to example embodiments. In the method of manufacturing a graphene device according to example embodiments, a stack structure including a first metal layer, a graphene layer, a second metal layer, and a protection layer is used to prevent or reduce damage to graphene as much as possible and to pattern the graphene into a desired pattern. Also, the number of photolithography processes or etching processes may be reduced compared to a conventional method of manufacturing a graphene device. Hereinafter, the method manufacturing a graphene device, according to example embodiments, will be described in detail.

As shown in FIG. 1A, an insulating material layer 120 may be formed on a substrate 110. The substrate 110 may be formed of any of various materials. The substrate 110 may be, for example, a semiconductor substrate or a polymer substrate. The semiconductor substrate may include, for example, Si, Ge, GaAs, or GaN. The polymer substrate may include an organic polymer or an inorganic polymer. Besides, the substrate 110 may be formed of quartz or glass. The insulating material layer 120 may be formed of an insulating material, for example, silicon nitride or silicon oxide.

Figure 1B:
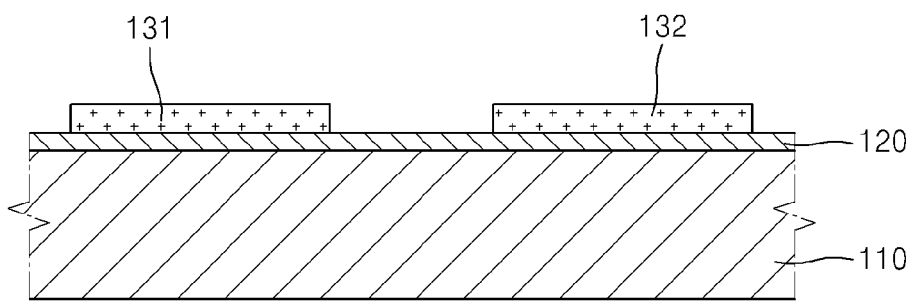

As shown in FIG. 1B, a first metal pad 131 and a second metal pad 132 are formed on the insulating material layer 120 to be spaced apart from each other. A process of forming the first metal pad 131 and the second metal pad 132 may include an operation of forming a metal material layer on the insulating material layer 120 and an operation of patterning the metal material layer into a desired pattern. The patterning process may use a general metal patterning method, e.g., photolithography or lift-off. The metal material may be any one of gold (Au), copper (Cu), palladium (Pd), nickel (Ni), titanium (Ti), chromium (Cr), iron (Fe), cobalt (Co), platinum (Pt), and ruthenium (Ru).

Figure 1C:
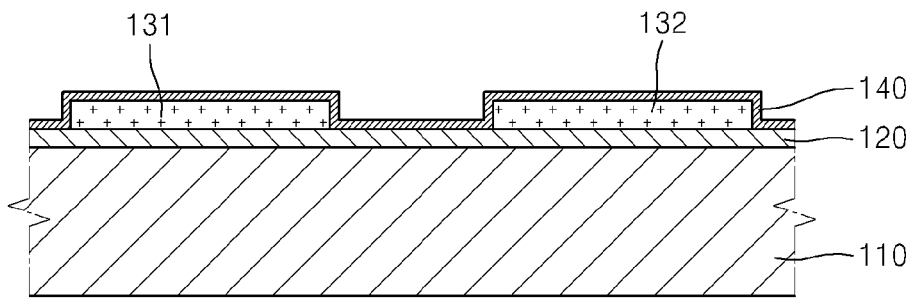

As shown in FIG. 1C, a graphene layer 140 is formed between the first metal pad 131 and the second metal pad 132 on the insulating material layer 120. The graphene layer 140 may be formed to cover all the insulating material layer 120, the first metal pad 131, and the second metal pad 132, as shown in FIG. 1C.

The graphene layer 140 may be formed by the procedures such that graphene is grown on another substrate by chemical vapor deposition (CVD) in advance and then the graphene is transferred onto a structure shown in FIG. 1B. For example, a substrate on which a metal catalyst layer is formed and a gas containing carbon ($CH_4$, $C_2H_2$, $C_2H_4$, or CO) are put into a reactor for thermal chemical vapor deposition or inductive coupled plasma chemical vapor deposition (ICP-CVD), the substrate and the gas are heated to allow carbon to be absorbed into the metal catalyst layer, and then the carbon is separated from the metal catalyst layer and crystallized by rapidly cooling the resultant product, thereby growing the graphene on the substrate. Polymethyl methacrylate (PMMA) may be coated as a supporting layer on the graphene by spin coating, and/or an adhesive tape, glue, an epoxy resin, e.g., poly carbonate, a thermal release tape, or a water-soluble tape may be adhered to the graphene, and the resultant product may be transferred onto the structure shown in FIG. 1B. The supporting layer is removed to thus form a structure shown in FIG. 1C.

A part of the graphene layer 140 may be defined as an active area A. The active area A may be used as a nanogap electrode, a sensor, or a channel layer according to a particular function of the graphene device to be manufactured and may be defined as an area to be protected so that graphene is not damaged during the manufacturing of the graphene device.

Figure 1D:
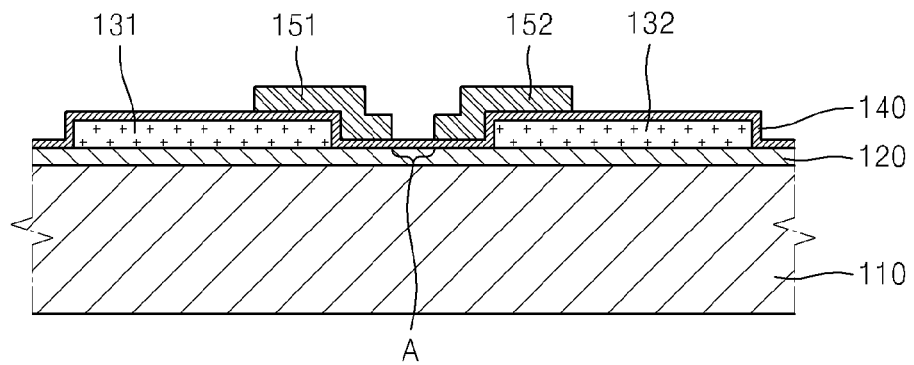
Figure 1E:
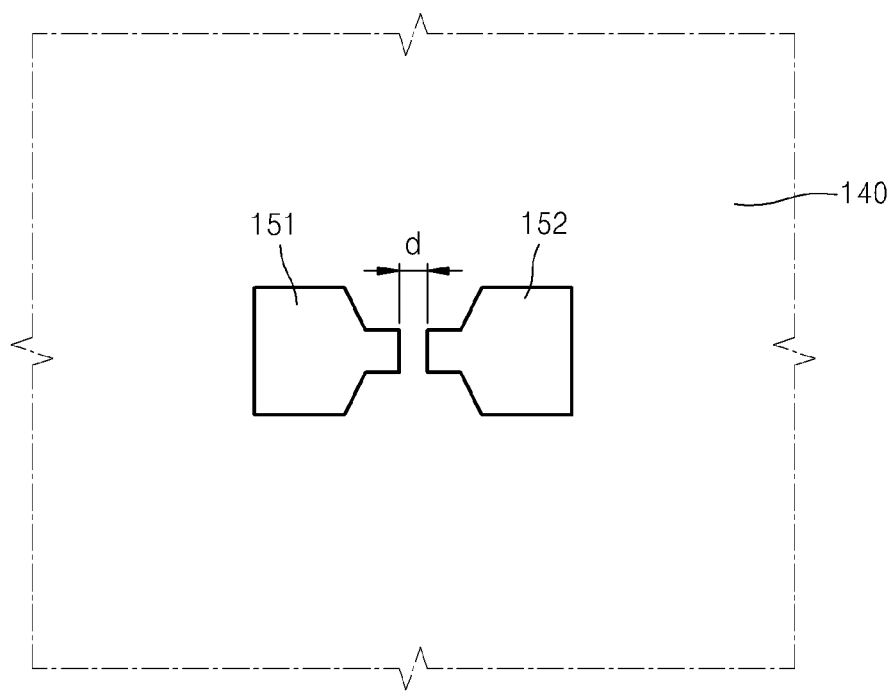

As shown in FIG. 1D, a third metal pad 151 and a fourth metal pad 152 may be formed on the graphene layer 140 to be spaced apart from each other with the active area A therebetween, wherein the third metal pad 151 and the fourth metal pad 152 extend above the first metal pad 131 and the second metal pad 132, respectively. The third metal pad 151 and the fourth metal pad 152 may be formed by forming a metal material layer on the graphene layer 140 and patterning the metal material layer into the third metal pad 151 and the fourth metal pad 152, as shown in FIG. 1E. A distance d between the third metal pad 151 and the fourth metal pad 152 is a width of the active area A. The distance d corresponds to, for example, a nanogap when the graphene layer 140 is used as a nanogap device. The metal material layer may be patterned by using a general metal patterning method, e.g., photolithography or lift-off. Also, if the active area A is so small and thus micro-patterning is required, electron beam lithography may be used. The metal material layer may include any one of Au, Cu, Pd, Ni, Ti, Cr, Fe, Co, Pt, and Ru. The metal material layer may be formed to have a thickness in a range between about 10 nm and about 1000 nm.

Figure 1F:
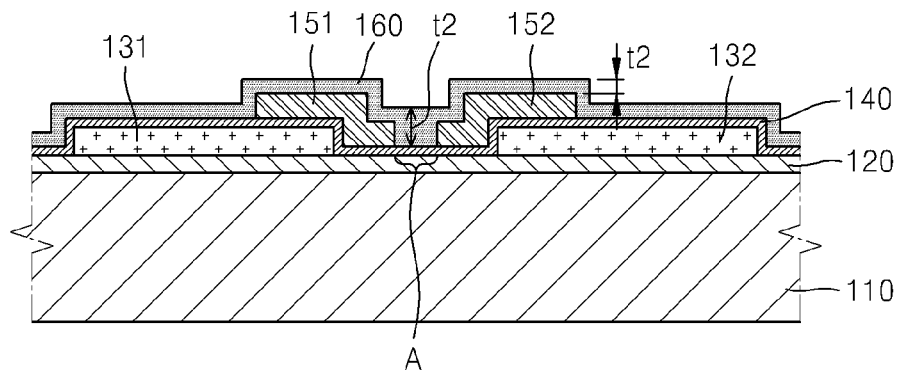

As shown in FIG. 1F, a first protection layer 160 may be formed to cover all the first metal pad 131, the second metal pad 132, the graphene layer 140, the third metal pad 151, and the fourth metal pad 152.

The first protection layer 160 may include any one of $Al_2O_3$, $SiO_2$, HfO, and SiNx and may be formed by atomic layer deposition (ALD), CVD, or evaporation. In an operation of forming the first protection layer 160, a step coverage characteristic is important. In other words, a material for forming the first protection layer 160 needs to be deposited on a lateral surface as well as a top surface of a structure shown in FIG. 1D.

The first protection layer 160 may be formed in such a way that a thickness t2 of the first protection layer 160 on the active area A is greater than a thickness t1 of the first protection layer 160 formed on an area other than the active area A. For this, the first protection layer 160 may be deposited to have the thickness t1, and the thickness t1 may be greater than or equal to half the distance d between the third electrode pad 151 and the fourth electrode pad 152, that is, t1 d/2.

Figure 1G:
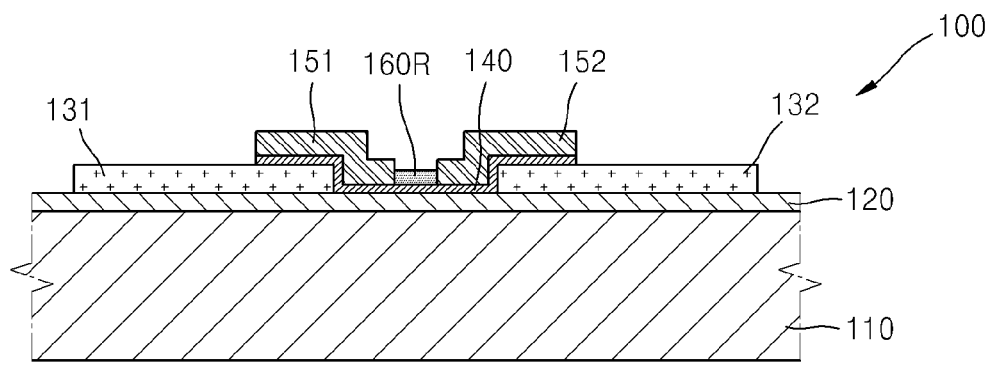

The entire surface of the first protection layer 160 is etched thereby forming the graphene device 100 as shown in FIG. 1G. In the etching of the first protection layer 160, the graphene layer 140 formed on the first metal pad 131 and the first metal pad 132 may also be etched to expose the first metal pad 131 and the first metal pad 132. The exposed first metal pad 131 and first metal pad 132 may be used as, for example, an electrode pad for measuring a reaction occurring in the active area A, for example, an electrical change.

As shown in FIG. 1G, a residual layer 160R, which is a part of the material for forming the first protection layer 160, remains on the active area A. The residual layer 160R results from the first protection layer 160 that is formed to be relatively thick on the active area A compared to other areas. Thus, another process for leaving the residual layer 160R is unnecessary when etching the entire surface of the first protection layer 160.

Figure 1H:
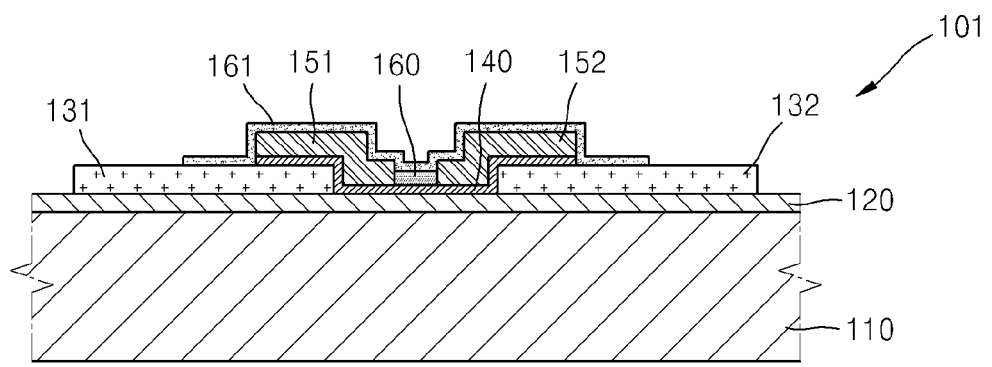

FIG. 1H shows a graphene device 101 in which a second protection layer 161 is further formed to cover all the third electrode pad 151 and the fourth electrode pad 152 and parts of the first electrode pad 131 and the second electrode pad 132. The second protection layer 161 may be formed of an insulating material, e.g., $Al_2O_3$, $SiO_2$, HfO, or SiNx.

Figure 2A:
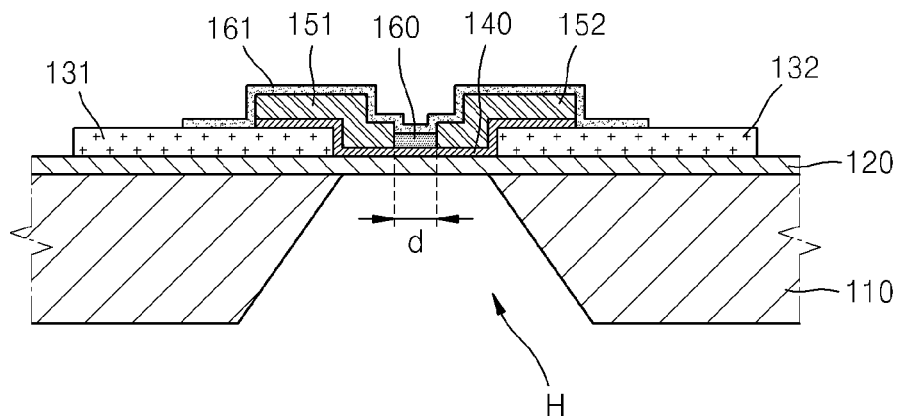
FIGS. 2A and 2B are views for describing a method of manufacturing a graphene device, according to example embodiments.
Figure 2B:
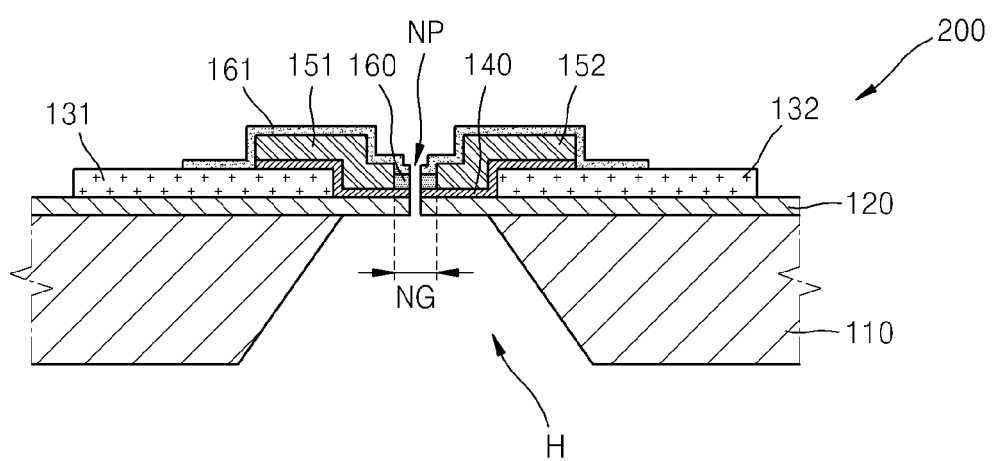

FIGS. 2A and 2B are views for describing a method of manufacturing a graphene device 200, according to example embodiments. FIGS. 2A and 2B show an example where the graphene device 200 is operated as a nanogap device in which an opening H and a nanopore NP are additionally formed in the resultant product shown in FIG. 1H The distance d between the third electrode pad 151 and the fourth electrode pad 152 will be the nanogap NG. As shown in FIG. 2A, the opening H may be formed in a lower portion of the substrate 110 to expose the insulating material layer 120. As shown in FIG. 2B, the nanopore NP may be formed to penetrate the second protection layer 161, the first protection layer 160, the active area A of the graphene layer 140, and the insulating material layer 120.

The opening H formed in the substrate 110 has a size equal to or less than several μm. A lateral surface of the opening H may be formed as an inclined surface, and may have a shape, for example, in which a width of the opening H decreases toward a top surface of the substrate 110 on which the insulating material layer 120 is formed. Although not shown in FIGS. 2A and 2B, an etching mask layer for forming a predetermined or given opening may further be formed on a bottom surface of the substrate 110. Also, the nanopore NP may be formed to be connected to the opening H by using a transmission electron microscope (TEM).

In the manufactured graphene device 200, the graphene layer 140 may be operated as a nanogap electrode. For example, a tunneling current generated when target bio-molecules, e.g., deoxyribonucleic acid (DNA) or ribonucleic acid (RNA), pass through the nanopore NP may be measured from the nanogap electrode. When the graphene layer 140 is used, the graphene layer 140 may be formed to have a smaller thickness than a general metal material, and thus, a length of the nanogap electrode through which the target bio-molecules pass, that is, the thickness of the graphene layer 140, may be relatively short, thereby increasing a resolution of detection. Also, damage to the graphene layer 140 may be minimized or reduced according to the above-described manufacturing process, and thus the graphene layer 140 may be used as a highly sensitive DNA detecting system.

Figure 3:
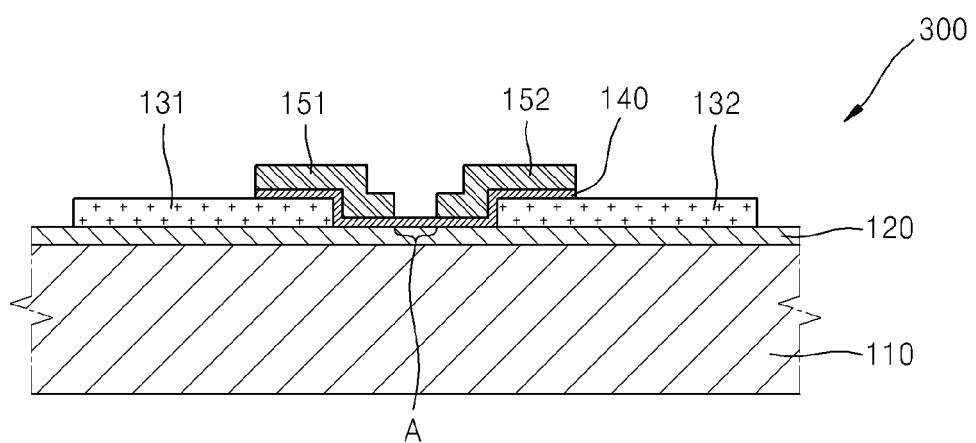
FIG. 3 is a view for describing a method of manufacturing a graphene device, according to example embodiments.

FIG. 3 is a view for describing a method of manufacturing a graphene device 300, according to example embodiments. FIG. 3 shows an example where the graphene device 300 is operated as a graphene sensor. As shown in FIG. 3, a residual layer on the active area A is removed to expose the active area A of the graphene layer 140. The graphene layer 140 serves as a sensor for a specific material. Changes in electrical characteristics due to adhesion of the specific material to the active area A may be measured from the first metal pad 131 and the second metal pad 132.

Figure 4:
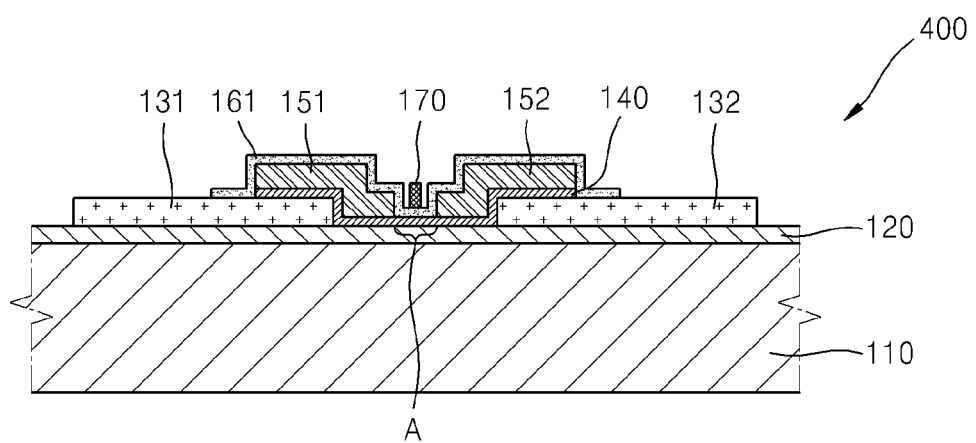
FIG. 4 is a view for describing a method of manufacturing a graphene device, according to example embodiments.

FIG. 4 is a view for describing a method of manufacturing a graphene device 400, according to example embodiments. The graphene device 400 may have a structure in which a gate layer 170 is further formed in the active area A. The gate layer 170 may be formed of a metal material with a relatively high conductivity, for example, Pt, Ru, Au, Ag, Mo, Al, W, or Cu. The first metal pad 131 and the second metal pad 132 may serve as a source electrode and a drain electrode, respectively, and the graphene device 400 may operate as a field effect transistor (FET) using the graphene layer 140 as a channel layer.

According to the above-described method of manufacturing a graphene device, a stack structure including a first metal layer, a graphene layer, a second metal layer, and a protection layer may be used to pattern the graphene device into a desired pattern, and damage to graphene may be minimized or reduced, and thus a high-quality graphene material may be used as an active area, thereby manufacturing the graphene device, e.g., a nanogap device, a graphene sensor, or an FET of a relatively high quality.

It should be understood that example embodiments described therein should be considered in a descriptive sense only and not for purposes of limitation. Descriptions of features or aspects within each embodiment should typically be considered as available for other similar features or aspects in other embodiments.

What is claimed is:

1. A method of manufacturing a graphene device, the method comprising:
    forming an insulating material layer on a substrate;
    forming a first metal pad and a second metal pad on the insulating material layer to be spaced apart from each other;
    forming a graphene layer between the first metal pad and the second metal pad on the insulating material layer, the graphene layer having a portion defined as an active area;
    forming a third metal pad and a fourth metal pad on the graphene layer to be spaced apart from each other with the active area therebetween, the third metal pad extending from the graphene layer between the first metal pad and the second metal pad to an upper surface of the first metal pad and the fourth metal pad extending from the graphene layer between the first metal pad and the second metal pad to an upper surface of the second metal pad;
    forming a first protection layer having a first portion covering the active area and a second portion covering the first metal pad, the second metal pad, the third metal pad, and the fourth metal pad; and
    etching an entire surface of the first protection layer until only a residual layer made of a material for the forming a first protection layer remains on the active area,
    wherein a thickness of the first portion of the first protection layer is thicker than the second portion of the first protection layer.

2. The method of claim 1, wherein the forming a first metal pad and a second metal pad includes:
    forming a first metal layer on the insulating material layer; and
    patterning the first metal layer.

3. The method of claim 2, wherein the forming a first metal layer includes forming any one of gold (Au), copper (Cu), palladium (Pd), nickel (Ni), titanium (Ti), chromium (Cr), iron (Fe), cobalt (Co), platinum (Pt), and ruthenium (Ru).

4. The method of claim 1, wherein the forming a graphene layer includes forming the graphene layer to cover all of the insulating material layer, the first metal pad, and the second metal pad.

5. The method of claim 4, wherein the forming a graphene layer includes:
    forming graphene on a metal catalyst layer by chemical vapor deposition (CVD); and
    transferring the formed graphene onto the insulating material layer, the first metal pad, and the second metal pad.

6. The method of claim 1, wherein the forming a third metal pad and a fourth metal pad includes:
    forming a second metal layer on the graphene layer; and
    patterning the second metal layer.

7. The method of claim 6, wherein the forming a second metal layer includes forming any one of Au, Cu, Pd, Ni, Ti, Cr, Fe, Co, Pt, and Ru.

8. The method of claim 6, wherein the forming a second metal layer includes forming the second metal layer to have a thickness in a range between about 10 nm and about 1000 nm.

9. The method of claim 1, wherein the forming a first protection layer includes one of an atomic layer deposition (ALD) process, CVD process, and evaporation process.

10. The method of claim 1, wherein the forming a first protection layer includes forming any one of $Al_2O_3$, $SiO_2$, HfO, and SiNx.

11. The method of claim 1, wherein the forming a first protection layer includes forming the first protection layer to have a thickness that is equal to or greater than half a distance between the third electrode pad and the fourth electrode pad.

12. The method of claim 1, further comprising:
    etching, the first protection layer, the active area, and the insulating material layer to form a nanopore penetrating the first protection layer, the active area, and the insulating material layer.

13. The method of claim 1, further comprising:
    etching a lower portion of the substrate to form an opening exposing the insulating material layer.

14. The method of claim 1, further comprising:
    removing the residual layer remaining on the active area.

15. The method of claim 1, further comprising:
    forming a gate layer on the residual layer remaining on the active area, the gate layer including a metal material.

16. A graphene device comprising:
    an insulating material layer on a substrate;
    a first metal pad and a second metal pad on the insulating material layer, the first metal pad and the second metal pad spaced apart from each other;
    a graphene layer between the first metal pad and the second metal pad on the insulating material layer, the graphene layer having a portion defined as an active area;

a third metal pad and a fourth metal pad on the graphene layer and spaced apart from each other with the active area therebetween, the third metal pad extending from the graphene layer between the first metal pad and the second metal pad to an upper surface of the first metal pad and the fourth metal pad extending from the graphene layer between the first metal pad and the second metal pad to an upper surface of the second metal pad; and a first protection layer having a first portion configured to cover the active area and a second portion configured to cover the first metal pad, the second metal pad, third metal pad and the fourth metal pad, wherein a thickness of the first portion of the first protection layer is thicker than the second portion of the first protection layer.

17. The graphene device of claim 16, wherein a lower portion of the substrate includes an opening exposing the insulating material layer, further comprising:

a nanopore penetrating the protection layer, the graphene layer, and the insulating material layer.

* * * * *